United States Patent
Cideciyan et al.

(10) Patent No.: US 11,381,258 B2
(45) Date of Patent: *Jul. 5, 2022

(54) PARTIAL REVERSE CONCATENATION FOR DATA STORAGE DEVICES USING COMPOSITE CODES

(71) Applicant: Awemane Ltd., Grand Cayman (KY)

(72) Inventors: Roy D. Cideciyan, Rueschlokon (CH); Robert A. Hutchins, Tucson, AZ (US); Thomas Mittelholzer, Zurich (CH); Sedat Oelcer, Kilchberg (CH)

(73) Assignee: Awemane Ltd., Grand Cayman (KY)

( * ) Notice: Subject to any disclaimer, the term of this patent is extended or adjusted under 35 U.S.C. 154(b) by 28 days.

This patent is subject to a terminal disclaimer.

(21) Appl. No.: 16/734,905

(22) Filed: Jan. 6, 2020

(65) Prior Publication Data

US 2020/0153460 A1 May 14, 2020

Related U.S. Application Data

(63) Continuation of application No. 14/920,715, filed on Oct. 22, 2015, now Pat. No. 10,680,655, which is a
(Continued)

(51) Int. Cl.
*H03M 13/29* (2006.01)
*G11B 20/14* (2006.01)
(Continued)

(52) U.S. Cl.
CPC ..... *H03M 13/2906* (2013.01); *G06F 11/1076* (2013.01); *G11B 20/1426* (2013.01);
(Continued)

(58) Field of Classification Search
CPC ......... H03M 13/2906; H03M 13/1515; H03M 13/253; H03M 13/2945; H03M 13/29;
(Continued)

(56) References Cited

U.S. PATENT DOCUMENTS

| 4,888,775 A | 12/1989 | Karabed et al. |
| 5,731,768 A | 3/1998 | Tsang |

(Continued)

FOREIGN PATENT DOCUMENTS

| CN | 1684182 A | 10/2005 |
| CN | 102272841 A | 12/2011 |

(Continued)

OTHER PUBLICATIONS

Corrected Notice of Allowance from U.S. Appl. No. 14/920,715, dated May 14, 2020.
(Continued)

*Primary Examiner* — Albert Decady
*Assistant Examiner* — Enam Ahmed
(74) *Attorney, Agent, or Firm* — Seed IP Law Group LLP

(57) ABSTRACT

In one embodiment, a system includes a processor, and logic integrated with the processor, executable by the processor, or integrated with and executable by the processor. The logic is configured to cause the processor to write, by the processor, data to a storage medium of a data storage system using a partial reverse concatenated modulation code. The partial reverse concatenated modulation code comprises encoding the data by applying a C2 encoding scheme prior to encoding the data by applying one or more modulation encoding schemes, followed by encoding the data by applying a C1 encoding scheme subsequent to the encoding of the data with the one or more modulation encoding schemes.

20 Claims, 11 Drawing Sheets

Related U.S. Application Data continuation of application No. 13/483,026, filed on May 29, 2012, now Pat. No. 9,178,534.

(51) Int. Cl.
| | |
|---|---|
| *H03M 13/15* | (2006.01) |
| *H03M 13/25* | (2006.01) |
| *G06F 11/10* | (2006.01) |
| *G11B 20/18* | (2006.01) |
| *H03M 13/09* | (2006.01) |
| *H03M 13/11* | (2006.01) |

(52) U.S. Cl.
CPC ..... *H03M 13/1515* (2013.01); *H03M 13/253* (2013.01); *H03M 13/29* (2013.01); *H03M 13/2945* (2013.01); *G11B 2020/1836* (2013.01); *G11B 2020/1853* (2013.01); *G11B 2220/956* (2013.01); *H03M 13/09* (2013.01); *H03M 13/1102* (2013.01); *H03M 13/2909* (2013.01); *H03M 13/2957* (2013.01)

(58) Field of Classification Search
CPC ............. H03M 13/09; H03M 13/1102; H03M 13/2909; H03M 13/2957; G06F 11/1076; G11B 20/1426; G11B 2020/1836; G11B 2020/1853; G11B 2220/956
USPC ......................................................... 714/756
See application file for complete search history.

(56) References Cited

U.S. PATENT DOCUMENTS

| | | | |
|---|---|---|---|
| 5,757,294 A | 5/1998 | Fisher et al. | |
| 5,996,104 A | 11/1999 | Herzberg | |
| 6,112,324 A * | 8/2000 | Howe | G11B 20/1217 |
| | | | 714/766 |
| 6,172,829 B1 | 1/2001 | Ozaki et al. | |
| 6,184,806 B1 | 2/2001 | Patapoutian et al. | |
| 6,304,995 B1 | 10/2001 | Smith et al. | |
| 6,539,514 B1 | 3/2003 | Bartlett | |
| 6,718,505 B1 * | 4/2004 | Kravtchenko | G11B 20/18 |
| | | | 714/756 |
| 6,757,122 B1 | 6/2004 | Kuznetsov et al. | |
| 6,801,495 B1 * | 10/2004 | Faruque | H04J 13/18 |
| | | | 370/208 |
| 6,895,547 B2 | 5/2005 | Eleftheriou et al. | |
| 6,901,119 B2 | 5/2005 | Cideciyan et al. | |
| 6,907,506 B2 | 6/2005 | Proidl | |
| 6,961,888 B2 | 11/2005 | Jin et al. | |
| 7,000,167 B2 | 2/2006 | Coker et al. | |
| 7,030,789 B1 | 4/2006 | Cideciyan et al. | |
| 7,065,698 B2 | 6/2006 | Oh | |
| 7,071,851 B1 | 7/2006 | Blaum et al. | |
| 7,127,657 B2 * | 10/2006 | Watanabe | G11B 20/1833 |
| | | | 714/755 |
| 7,205,912 B1 | 4/2007 | Yang et al. | |
| 7,246,294 B2 | 7/2007 | Kauschke et al. | |
| 7,246,299 B2 * | 7/2007 | Saito | G11B 20/00086 |
| | | | 714/756 |
| 7,266,748 B2 * | 9/2007 | Kwon | G11B 20/1866 |
| | | | 714/755 |
| 7,266,750 B1 | 9/2007 | Patapoutian et al. | |
| 7,405,678 B2 | 7/2008 | Cherubini | |
| 7,409,622 B1 | 8/2008 | Lu et al. | |
| 7,486,208 B2 | 2/2009 | Cideciyan et al. | |
| 7,530,003 B2 | 5/2009 | Lee et al. | |
| 7,616,134 B1 | 11/2009 | Mittelholzer | |
| 7,650,561 B1 | 1/2010 | Ulriksson et al. | |
| 7,679,535 B2 | 3/2010 | Cideciyan et al. | |
| 7,725,800 B2 | 5/2010 | Yang et al. | |
| 7,827,464 B2 | 11/2010 | Kuznetsov et al. | |
| 7,873,894 B2 | 1/2011 | Eleftheriou et al. | |
| 7,876,516 B2 | 1/2011 | Cideciyan et al. | |
| 7,877,662 B2 | 1/2011 | Eleftheriou et al. | |
| 7,971,130 B2 | 6/2011 | Ramamoorthy | |
| 8,046,660 B2 | 10/2011 | Wu et al. | |
| 8,046,661 B2 * | 10/2011 | Lablans | H04L 1/0065 |
| | | | 714/757 |
| 8,049,648 B2 | 11/2011 | Chaichanavong | |
| 8,065,585 B1 | 11/2011 | Abbaszadeh et al. | |
| 8,583,979 B1 | 11/2013 | Zeng et al. | |
| 8,595,585 B2 | 11/2013 | Djordjevic et al. | |
| 8,615,699 B2 | 12/2013 | Eroz et al. | |
| 8,904,181 B1 * | 12/2014 | Felsher | H04L 63/0442 |
| | | | 713/171 |
| 9,178,534 B2 | 11/2015 | Cideciyan et al. | |
| 9,183,852 B2 | 11/2015 | Cideciyan et al. | |
| 9,190,076 B2 | 11/2015 | Cideciyan et al. | |
| 9,558,782 B2 | 1/2017 | Cideciyan et al. | |
| 10,484,018 B2 | 11/2019 | Cideciyan et al. | |
| 10,680,655 B2 | 6/2020 | Cideciyan et al. | |
| 2003/0108023 A1 | 6/2003 | Lehmann et al. | |
| 2004/0025106 A1 | 2/2004 | Massey | |
| 2005/0207506 A1 | 9/2005 | Wami | |
| 2007/0086539 A1 | 4/2007 | Hocevar | |
| 2007/0168834 A1 | 7/2007 | Eroz et al. | |
| 2007/0288834 A1 | 12/2007 | Crozier et al. | |
| 2008/0089427 A1 * | 4/2008 | Xia | H03M 13/2721 |
| | | | 375/240.24 |
| 2008/0235559 A1 | 9/2008 | Yang | |
| 2009/0235142 A1 | 9/2009 | Galbraith et al. | |
| 2010/0180180 A1 | 7/2010 | Cideciyan et al. | |
| 2010/0241923 A1 | 9/2010 | Wang et al. | |
| 2010/0241925 A1 | 9/2010 | Wang et al. | |
| 2010/0241926 A1 | 9/2010 | Wang et al. | |
| 2010/0268918 A1 | 10/2010 | Priewasser et al. | |
| 2010/0299581 A1 | 11/2010 | Divsalar et al. | |
| 2010/0303176 A1 | 12/2010 | Lilleberg et al. | |
| 2011/0107187 A1 | 5/2011 | Gill et al. | |
| 2011/0161785 A1 | 6/2011 | Pyndiah et al. | |
| 2011/0191652 A1 | 8/2011 | Dave et al. | |
| 2011/0252290 A1 | 10/2011 | Cideciyan et al. | |
| 2011/0258509 A1 | 10/2011 | Ramamoorthy | |
| 2012/0047415 A1 | 2/2012 | Djordjevic et al. | |
| 2013/0279040 A1 | 10/2013 | Cideciyan et al. | |
| 2013/0283127 A1 | 10/2013 | Cideciyan et al. | |
| 2013/0326305 A1 | 12/2013 | Cideciyan et al. | |
| 2013/0326306 A1 | 12/2013 | Cideciyan et al. | |
| 2013/0326307 A1 | 12/2013 | Cideciyan et al. | |
| 2013/0326311 A1 | 12/2013 | Cideciyan et al. | |
| 2016/0043742 A1 | 2/2016 | Cideciyan et al. | |
| 2017/0126254 A1 | 5/2017 | Cideciyan et al. | |

FOREIGN PATENT DOCUMENTS

| | | |
|---|---|---|
| JP | 3898144 A | 4/1996 |
| JP | 2001067813 A | 3/2001 |
| JP | 2004164767 A | 6/2004 |
| JP | 2005302154 A | 10/2005 |
| JP | 2007200441 A | 8/2007 |
| JP | 2008146828 A | 6/2008 |
| JP | 2010521764 A | 6/2010 |
| WO | 2008116725 A1 | 10/2008 |
| WO | 2010078992 A1 | 7/2010 |

OTHER PUBLICATIONS

Cideciyan et al., U.S. Appl. No. 13/483,004, filed May 29, 2012.
Non-Final Office Action from U.S. Appl. No. 13/483,004, dated Jul. 16, 2014.
Cideciyan et al., U.S. Appl. No. 13/758,752, filed Feb. 4, 2013.
Non-Final Office Action from U.S. Appl. No. 13/758,752, dated Jul. 16, 2014.
Cideciyan et al., U.S. Appl. No. 13/483,015, filed May 29, 2012.
Non-Final Office Action from U.S. Appl. No. 13/483,015, dated Jul. 15, 2014.
Cideciyan et al., U.S. Appl. No. 13/483,026, filed May 29, 2012.
Non-Final Office Action from U.S. Appl. No. 13/483,026, dated Apr. 10, 2014.

(56) References Cited

OTHER PUBLICATIONS

Final Office Action from U.S. Appl. No. 13/483,026, dated Oct. 23, 2014.
International Search Report and Written Opinion from International Application No. PCT/EP2013/060100, dated Sep. 16, 2013.
International Search Report and Written Opinion from International Application No. PCT/CN2013/072908, dated Jun. 27, 2013.
Non-Final Office Action from U.S. Appl. No. 13/454,935, dated Oct. 24, 2013.
Notice of Allowance from U.S. Appl. No. 13/454,935, dated Feb. 21, 2014.
INSIC, "International Magnetic Tape Storage Technology Roadmap Workshop," Information Storage Industry Consortium, Aug. 24-25, 2011, pp. 1-5.
Hewlett Packard, "QuickSpecs HP StorageWorks LTO Ultrium Tape Drive," Worldwide QuickSpecs—Version 2, Jun. 18, 2010, pp. 1-35.
Blu-Ray Disc Association "Blu-ray Disc Format, 1. A Physical Format Specifications for BD-RE," White Paper, 3rd Edition, Oct. 2010, pp. M2.
Blu-Ray Disc Association, "Blu-ray Disc Format, 1. B Physical Format Specifications for BD-R," White Paper, 5th Edition, Oct. 2010, pp. 1-39.
Blu-Ray Disc Association "Blu-ray Disc Format, 1. C Physical Format Specifications for BD-ROM," White Paper, 6th Edition, Oct. 2010, pp. 1-48.
Advisory Action from U.S. Appl. No. 13/483,015, dated Apr. 14, 2015.
Advisory Action from U.S. Appl. No. 13/483,026, dated Jan. 14, 2015.
Argumedo et al., "Scaling Tape-Recording Areal Densitites to 100 GB/in2," 2008 IBM, IBM Journal of Research and Development, vol. 52, No. 4/5, Jul./Sep. 2008, pp. 513-527.
Asthana et al., "Rewritable Optical Disk Drive Technology," 1996 IBM, IBM Journal of Research and Development, vol. 40, No. 5, Sep. 1996, pp. 543-558.
Benedetto et al., "A Soft-Input Soft-Output Maximum A Posteriori (MAP) Module to Decode Parallel and Serial Concantenated Codes," TDA Progress Report 42-127, Nov. 15, 1996, pp. 1-20.
Blahut, R.E., "Algebraic Codes for Data Transmission: Ch. 10 Beyond BCH Codes," Cambridge University Press 2003, pp. 1-8.
Blanksby et al., "A 690-mW 1-GB/s 1024-b, Rate-1/2 Low-Density Parity-Check Code Decoder," 2002 IEEE, IEEE Journal of Solid-State Circuits, vol. 37, No. 3, Mar. 2002, pp. 404-412.
Blaum et al., "Enumerative Encoding with Non-Uniform Modulation Constraints," 2007 IEEE, ISIT2007, Jun. 24-29, 2007, pp. 1831-1835.
Blaum et al., "High-Rate Modulation Codes for Reverse Concatenation," 2007 IEEE, IEEE Transactions on Magnetics, vol. 43, No. 2, Feb. 2007, pp. 740-743.
Blaum et al., "Reverse Concatenation with Maximum Transition Run (MTR) Codes for High-Density Perpendicular Recording," 2008 IEEE, Global Telecommunications Conference 2008, Nov. 30, 2008, pp. 1-4.
Bliss, W. G ., "Circuitry for Performing Error Correction Calculations on Baseband encoded Data to Eliminate Error Propogation," IBM Technical Disclosure Bulletin, vol. 23, Mar. 1981, pp. 4633-4634.
Choi, G., "The Front-End SOC for a Blu-ray Disc Recorder," 2004 IEEE, IEEE Communications Magazine,; Topics in Curcuits for Communications, Dec. 2004, pp. 124-131.
Cideciyan et al., "A PRML System for Digital Magnetic Recording," 1992 IEEE, IEEE Journal on Selected Areas in; Communications, vol. 10, No. 1, Jan. 1992, pp. 38-56.
Cideciyan et al., "Maximum Transition Run Codes for Generalized Partial Response Channels," 2001 IEEE, IEEE Journal on Selected Areas in Communications, vol. 19, No. 4, Apr. 2001, pp. 619-634.
Coene et al., "Channel Coding and Signal Processing for Optical Recording Systems Beyond DVD," 2001 IEEE,; IEEE Transactions on Magnetics, vol. 37, No. 2, Mar. 2001, pp. 682-688.

Costello Jr., D. J., "Modem Coding Theory," Coding Research Group, Department of Electrical Engineering, University of Notre Dame, 2009 School of Information Theory, Northwestern University, Aug. 10, 2009, pp. 1-160.
Fan et al., "Constraint Gain," 2004 IEEE, IEEE Transactions on Information Theory, vol. 50, No. 9, Sep. 2004, pp. 1989-2001.
Final Office Action from U.S. Appl. No. 13/483,004, dated Jan. 29, 2015.
Final Office Action from U.S. Appl. No. 13/483,015, dated Jan. 28, 2015.
Final Office Action from U.S. Appl. No. 13/758,752, dated Jan. 30, 2015.
Immink et al., "Codes for Digital Recorders," 1998 IEEE, IEEE Transactions on Information Theory, vol. 44, No. 6,; Oct. 1998, pp. 2260-2299.
Immink et al., "Extremely Efficient DC-Free RLL Codes for Optical Recording," 2001 IEEE, IEEE Transactions on Consumer Electronics, vol. 47, No. 4, Nov. 2001, pp. 910-914.
Immink, K. A., "A Survey of Codes for Optical Disk Recording," 2001 IEEE, IEEE Journal on Selected Areas in Communications, vol. 19, No. 4, Apr. 2001, pp. 756-764.
Immink, K. A., "Codes for Mass Data Storage Systems, Second Edition," 2004 Shannon Foundation Publishers, pp. 1-362.
Karp et al., "IBM TS1140 Tape Drive—Technology, Features and Function Whitepaper," 2011 IBM Corporation, IBM Systems Storage, Oct. 2011, pp. 1-44.
Mittelholzer et al., "Reverse Concatenation of Product and Modulation Codes," 2008 IEEE, IEEE Communications Society, ICC 2008, pp. 1991-1995.
Mittelholzer, T., "Enumerative Maximum-Transition-Run Codes," 2009 IEEE, ISIT 2009, Jun. 28-Jul. 3, 2009, pp. 1549-1553.
Narahara et al., "Optical Disc System for Digital Video Recording," 2000 Japanese Journal of Applied Physics Publication Board, Japanese Journal of Applied Physics, vol. 39, Part 1, No. 2B, Feb. 2000, pp. 912-919.
Niktash et al., "Recfec: A Reconfigurable FEC Processor for Viterbi, Turbo, Reed-Solomon and LDPC Coding," 2008 IEEE, IEEE Communications Society, WCNC 2008 Proceedings, pp. 605-610.
Notice of Allowance from U.S. Appl. No. 13/483,004, dated Apr. 13, 2015.
Notice of Allowance from U.S. Appl. No. 13/483,026, dated Apr. 14, 2015.
Notice of Allowance from U.S. Appl. No. 13/758,752, dated Apr. 8, 2015.
Ratnayake et al., "A High-Throughput Maximum a Posteriori Probability Detector," 2008 IEEE, IEEE Journal of Solid-State Circuits, vol. 43, No. 8, Aug. 2008, pp. 1846-1858.
Robertson et al., "Optimal and Sub-Optimal Maximum A Posteriori Algorithms Suitable for Turbo Decoding," European Transactions on Telecommunications, vol. 8, No. 2, Mar.-Apr. 1997, pp. 119-125.
Sawaguchi et al., "A Concatenated Coding Technique for Partial Response Channels," 2001 IEEE, IEEE Transactions on Magnetics, vol. 37, No. 2, Mar. 2001, pp. 695-703.
Sawaguchi et al., "Iterative Decoding for Concatenated Error Correction Coding in PRML Channel Systems," 1999 IEEE, Global Telecommunications Conference—Globecom '99, pp. 749-754.
Solowiejczyk, I. J., "DOTS Technology Introduction," Group 47, LLC, IBM, Jan. 30, 2012, pp. 1-10.
Viterbi, A. J., "An Intuitive Justification and a Simplified Implementation of the MAP Decoder for Convolutional Codes," 1998 IEEE, IEEE Journal on Selected Areas In Communications, vol. 16, No. 2, Feb. 1998, pp. 260-264.
Wijngaarden et al., "Maximum Runlength-Limited Codes with Error Control Capabilities," 2001 IEEE, IEEE Journal on Selected Areas in Communications, vol. 19, No. 4, Apr. 2001, pp. 602-611.
Notice of Allowance from U.S. Appl. No. 13/483,026, dated Jun. 22, 2015.
Notice of Allowance from U.S. Appl. No. 13/758,752, dated Jun. 26, 2015.
Notice of Allowance from U.S. Appl. No. 13/483,004, dated Jul. 2, 2015.
Corrected Notice of Allowance from U.S. Appl. No. 13/483,004, dated Jul. 30, 2015.

(56) References Cited

OTHER PUBLICATIONS

Corrected Notice of Allowance from U.S. Appl. No. 13/758,752, dated Jul. 30, 2015.
Corrected Notice of Allowance from U.S. Appl. No. 13/758,752, dated Sep. 16, 2015.
Office Action from Chinese Application No. 201310203913.9, dated Sep. 8, 2015.
Supplemental Notice of Allowance from U.S. Appl. No. 13/483,004, dated Oct. 13, 2015.
Corrected Notice of Allowance from U.S. Appl. No. 13/758,752, dated Oct. 13, 2015.
Notice of Allowance from U.S. Appl. No. 13/483,004, dated Oct. 13, 2015.
Examiner's Answer to Appeal Brief from U.S. Appl. No. 13/483,015, dated Nov. 4, 2015.
Cideciyan et al., U.S. Appl. No. 14/920,715, filed Oct. 22, 2015.
Corrected Examiner's Answer from U.S. Appl. No. 13/483,015, dated Mar. 9, 2016.
Notice of Allowance from U.S. Appl. No. 13/483,015, dated Aug. 3, 2016.
Non-Final Office Action from U.S. Appl. No. 14/920,715, dated Aug. 11, 2016.
Mac Williams et al., "The Theory of Error-Correcting Codes," North-Holland Publishing Company, 1977, pp. 1-762.
Richardson et al., "Modern Coding Theory," Cambridge University Press, Oct. 2007, pp. 1-576.
Ryan et al., "Channel Codes Classical and Modem," Cambridge University Press, 2009, pp. 1-692.
Notice of Allowance from U.S. Appl. No. 13/483,015, dated Sep. 20, 2016.
Notice of Rejection from Japanese Application No. 2015-514412, dated Aug. 30, 2016.
Corrected Notice of Allowance from U.S. Appl. No. 13/483,015, dated Oct. 6, 2016.
Cideciyan et al., U.S. Appl. No. 15/405,199, filed Jan. 12, 2017.
Non-Final Office Action from U.S. Appl. No. 14/920,715, dated Feb. 9, 2017.
Non-Final Office Action from U.S. Appl. No. 14/920,715, dated Jul. 13, 2017.
Non-Final Office Action from U.S. Appl. No. 14/920,715, dated Feb. 2, 2018.
Final Office Action from U.S. Appl. No. 14/920,715, dated Jun. 28, 2018.
Non-Final Office Action from U.S. Appl. No. 15/405,199, dated Sep. 10, 2018.
Examination Report from European Application No. 13 724 562.7, dated Feb. 1, 2019.
Final Office Action from U.S. Appl. No. 15/405,199, dated Apr. 4, 2019.
Advisory Action from U.S. Appl. No. 15/405,199, dated Jun. 20, 2019.
Notice of Allowance from U.S. Appl. No. 15/405,199, dated Jul. 3, 2019.
Notice of Allowance from U.S. Appl. No. 14/920,715, dated Sep. 18, 2019.
Corrected Notice of Allowance from U.S. Appl. No. 15/405,199, dated Oct. 8, 2019.
Notice of Allowance from U.S. Appl. No. 14/920,715, dated Dec. 27, 2019.

\* cited by examiner

PARTIAL REVERSE CONCATENATION FOR DATA STORAGE DEVICES USING COMPOSITE CODES

BACKGROUND

The present invention relates to data storage, and more particularly, to storing data using partial reverse concatenation that employs composite codes such as product codes and concatenated codes.

Efficient reverse concatenation of composite coding schemes is difficult to achieve. In general, reverse concatenation schemes have several advantages over other data storage techniques. Although reverse concatenation schemes employ large block sizes for modulation coding (MC) in order to achieve a high code rate and improve format efficiency, they do not suffer from error propagation because modulation decoding is performed after error correction coding (ECC) decoding. Moreover, reverse concatenation schemes allow the passing of soft information from the detector to the decoder thereby enabling the use of soft-decoding or iterative decoding techniques to improve error rate performance.

One reverse concatenation architecture for product codes performs conventional reverse concatenation in the sense that it reverses the order of ECC and MC. The rate of the modulation code in this approach is 0.9951 whereas the linear tape open (LTO) standard LTO-5 modulation code rate is 32/33=0.9697. Therefore, reversing the order of ECC and MC results in a 2.6% improvement in modulation code rate over the LTO-5 standard, thereby providing a higher tape format efficiency. The modulation code used in the above approach maintains the interleaved (I=11) modulation constraint satisfied in LTO-2 to LTO-5 tape drive standards. However, the G-constraint is weakened from G=14 in LTO-5 to G=22 due to the insertion of parity symbols by the column code which weakens the modulation constraints. Another significant drawback of the reverse concatenation scheme in the above approach is a high implementation complexity which exacerbates the use of this reverse concatenation architecture for product codes in actual practice. The existing reverse concatenation architecture for product codes requires a complete overhaul and redesign of existing data flow architectures which is prohibitively complex when backward compatibility must be provided. In addition to the implementation complexity, another drawback of the above approach is that C2 symbol insertion after MC weakens the achievable modulation constraints. Furthermore, this particular reverse concatenation scheme is not designed to satisfy non-uniform constraints. Therefore, the overall modulation constraints satisfied by this reverse concatenation scheme are not as tight as is desired. For any of these reasons, a system and technique which alleviates the problems associated with conventional reverse concatenation of product coding schemes would be very desirable.

SUMMARY

In one embodiment, a system includes a processor, and logic integrated with the processor, executable by the processor, or integrated with and executable by the processor. The logic is configured to cause the processor to write, by the processor, data to a storage medium of a data storage system using a partial reverse concatenated modulation code. The partial reverse concatenated modulation code comprises encoding the data by applying a C2 encoding scheme prior to encoding the data by applying one or more modulation encoding schemes, followed by encoding the data by applying a C1 encoding scheme subsequent to the encoding of the data with the one or more modulation encoding schemes.

In another embodiment, system includes a processor, and logic integrated with the processor, executable by the processor, or integrated with and executable by the processor. The logic is configured to cause the processor to receive, by the processor, a data stream including one or more data sets. The logic is also configured to cause the processor to encode, by the processor, the one or more data sets using a C2 encoding scheme, and add, by the processor, a header to each subunit of the one or more C2-encoded data sets after encoding the one or more data sets using the C2 encoding scheme. The logic is also configured to cause the processor to encode, by the processor, the headers of the one or more headerized data sets with a first modulation encoding scheme after adding the header to each of the one or more C2-encoded data sets, and encode, by the processor, data portions of the one or more headerized data sets with a second modulation encoding scheme after adding the headers to each of the one or more C2-encoded data sets. Furthermore, the logic is also configured to cause the processor to encode, by the processor, the data portions of the one or more modulation-encoded data sets using a C1 encoding scheme after encoding the data portions of the one or more headerized data sets with the second modulation encoding scheme, and combine, by the processor, the C1-encoded data portions with the modulation-encoded headers of the one or more data sets using a multiplexer. Also, the logic is configured to cause the processor to write, by the processor, the one or more combined C1- and C2-encoded data sets to data tracks of a linear tape open (LTO) format magnetic tape. The one or more data sets are encoded using the C2 encoding scheme before any portion of the one or more data sets are encoded using any of: the first modulation encoding scheme, the second modulation encoding scheme, and the C1 encoding scheme.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrates by way of example the principles of the invention.

DETAILED DESCRIPTION

Figure 1:
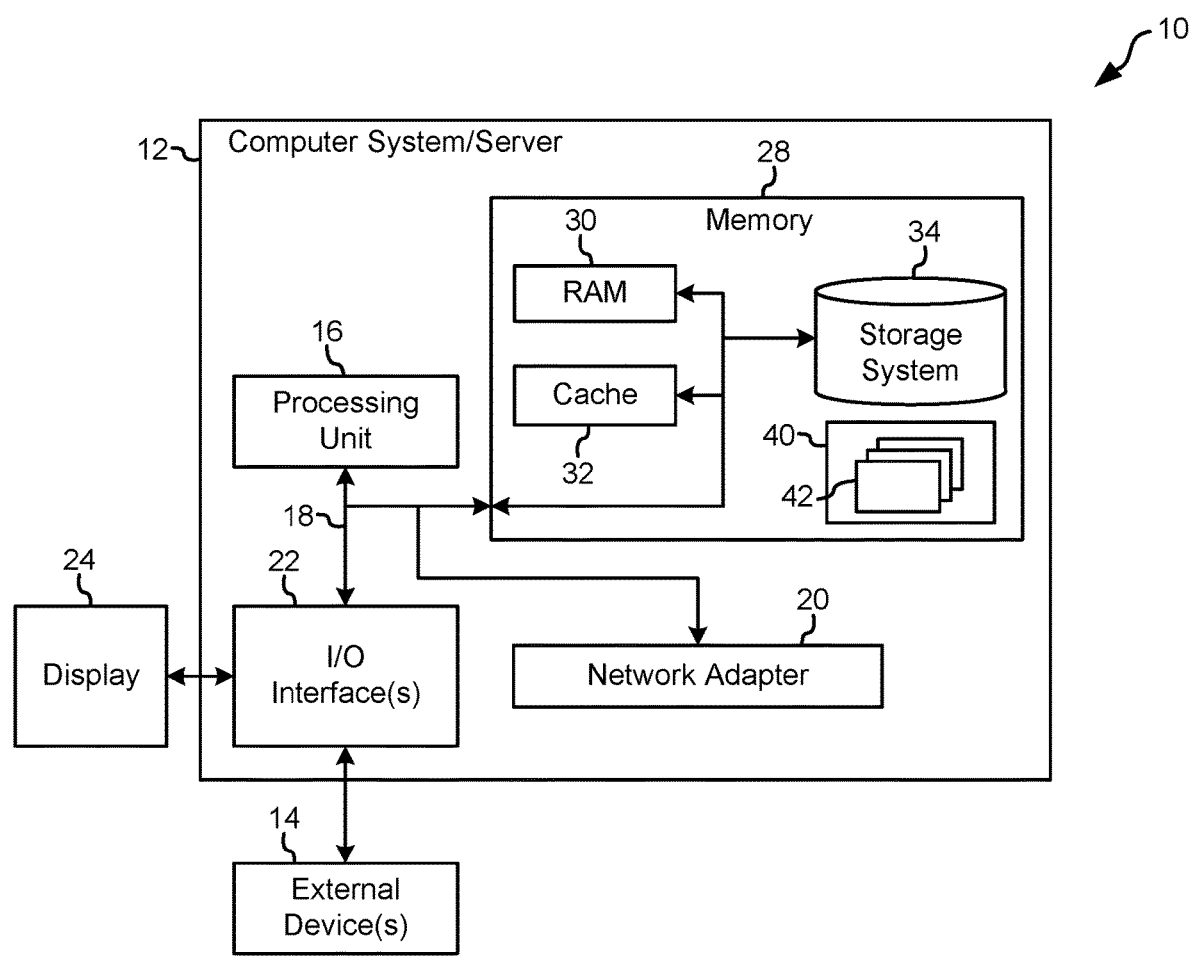
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

Conventional reverse concatenation (RC) schemes completely reverse the order of error correction coding (ECC) and modulation coding (MC). According to one embodiment, MC and ECC are not completely reversed and MC is performed subsequent to C2 ECC encoding but prior to C1 encoding. Accordingly, the RC techniques and systems described herein according to various embodiments utilize a RC scheme referred to as partial reverse concatenation (PRC).

The PRC scheme has several advantages over conventional RC schemes for product codes and concatenated codes. First, it is simple to implement since it relies on only switching the order of MC and C1 encoding as compared to conventional data flow architectures. Therefore, the PRC scheme may be implemented with relatively minor changes to an existing data flow architecture. Tape drive systems will benefit from this advantage as they have to satisfy backward compatibility requirements in order to be used effectively in existing installations. Another advantage is that C2 symbols do not have to be inserted into the MC-encoded data stream and the PRC scheme is capable of satisfying non-uniform modulation constraints resulting in tighter overall modulation constraints.

The PRC scheme may be used in hard disk drives (HDDs), optical storage drives, tape drives, etc., e.g., essentially any data storage device that employs a multi-stage ECC encoding architecture, such as a composite coding scheme. Some HDDs use one-dimensional concentric data tracks whereas some optical storage devices use a single one-dimensional spiral-shaped track to store data. In addition, some linear tape drives simultaneously write and read K parallel tracks, which are also parallel to an edge of the tape.

In one general embodiment, a method includes writing data to a storage medium of a data storage system using a partial reverse concatenated modulation code.

In another general embodiment, a method includes receiving a data stream including one or more data sets, encoding the one or more data sets using a C2 encoding scheme, adding a header to each subunit of the one or more data sets after encoding the one or more data sets using the C2 encoding scheme, encoding the headers of the one or more data sets with a first modulation encoding scheme after adding the header to each of the one or more C2-encoded data sets, encoding data portions of the one or more data sets with a second modulation encoding scheme after adding the headers to each of the one or more C2-encoded data sets, encoding portions of the one or more C2-encoded data sets using a C1 encoding scheme after encoding the portions of the one or more C2-encoded data sets with the second modulation encoding scheme, combining the C1-encoded portions with the modulation-encoded headers of the one or more C2-encoded data sets using a multiplexer, and writing the one or more combined C1- and C2-encoded data sets to data tracks of a linear tape open (LTO) format magnetic tape, wherein the one or more data sets are encoded using the C2 encoding scheme before any portion of the one or more data sets are encoded using the first modulation encoding scheme, the second modulation encoding scheme, and the C1 encoding scheme.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
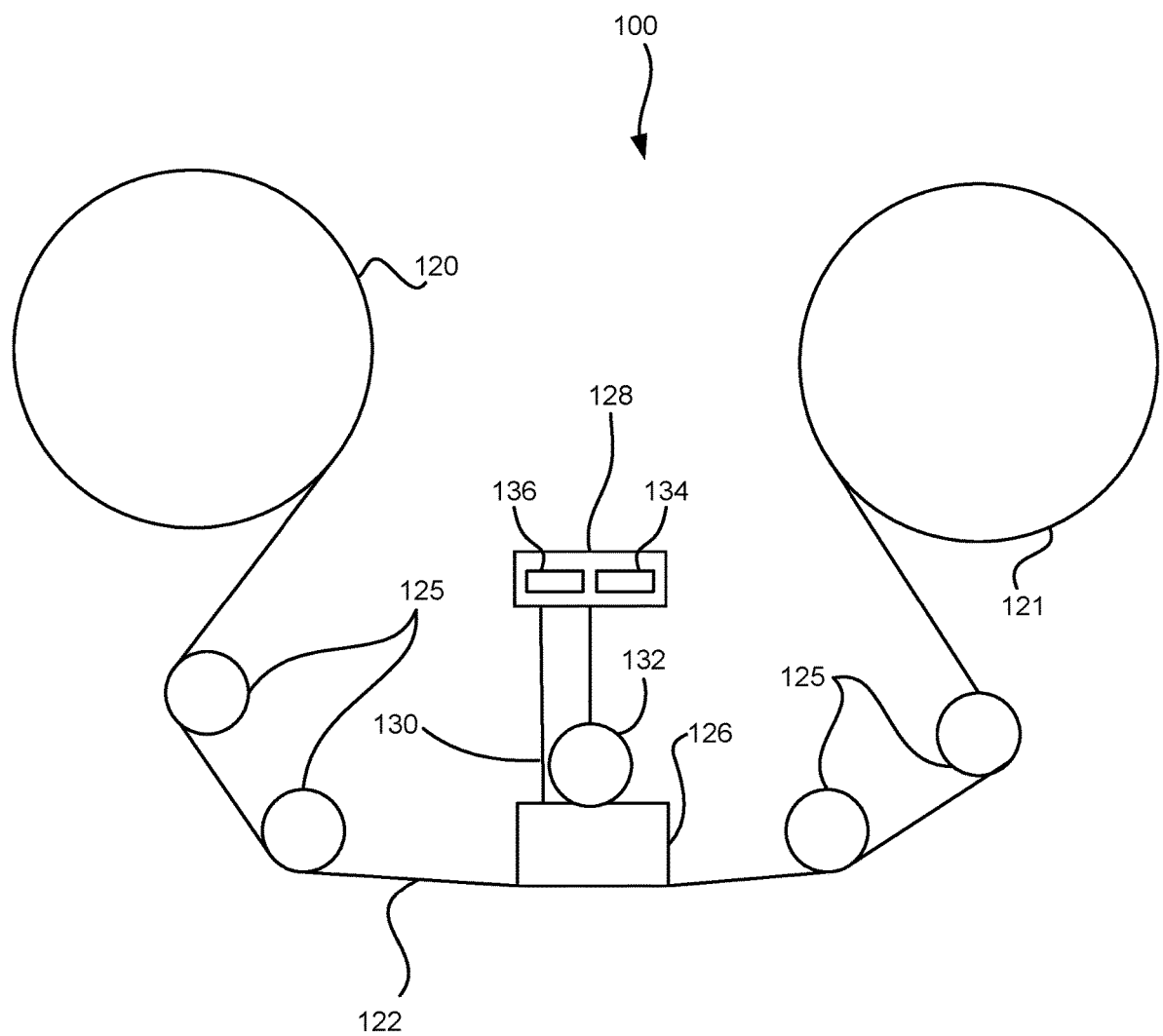
FIG. 2 illustrates a simplified tape drive of a tape-based data storage system, according to one embodiment.

FIG. 2 illustrates a simplified tape drive 100 of a tape-based data storage system, which may be employed according to various embodiments. While one specific implementation of a tape drive is shown in FIG. 2, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 2, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive and a host (integral or external) to send and receive the data and for controlling the operation of the tape drive and communicating the status of the tape drive to the host, all as will be understood by those of skill in the art.

ECC and MC are used in data storage to achieve very low bit error rates, e.g., magnetic tape storage products are designed to ensure bit error rates in the range of $1 \times 10^{-17}$ to $1 \times 10^{-19}$ under normal operating conditions. Linear block codes such as Reed-Solomon (RS) codes and low-density parity-check (LDPC) codes have generally been preferred ECC schemes used in data storage products.

MC schemes usually impose run-length constraints and therefore are also known as run-length limited (RLL) coding schemes. However, MC schemes may impose other types of modulation constraints that rule out the occurrence of specific data patterns embedded into MC-encoded data for purposes of synchronization, such as the 12T data separator sequence (DSS), the 33-bit resynchronization (Re-Sync) pattern in LTO-5 tape format, etc. Furthermore, they may ensure that the power spectral density of modulation-encoded data has spectral nulls at desired frequencies. For example, optical storage systems such as compact disc (CD), digital versatile disc (DVD) and Blu-ray disc (BD) employ modulation codes that exhibit a spectral null at zero frequency, i.e., dc-free codes.

Figure 3:
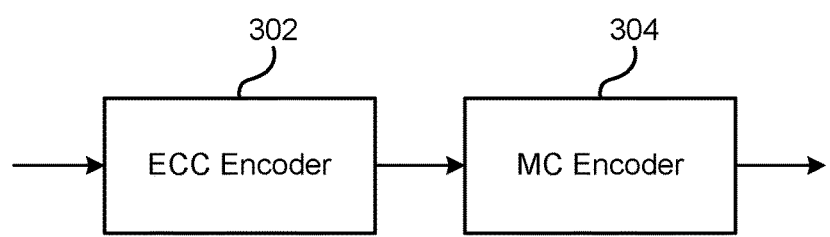
FIG. 3 is a forward concatenation scheme, according to the prior art.

In conventional storage systems using forward concatenation, as shown in FIG. 3, data is first encoded by an ECC encoder 302 using an ECC scheme and then encoded using an MC encoder 304 using an MC scheme. The forward concatenation scheme is known to have several drawbacks. In forward concatenation, also known as standard concatenation or conventional concatenation, the size of the modulation code words is relatively small in order to improve error rate performance by reducing or eliminating error propagation at the output of the modulation decoder.

However, this has the disadvantage that small modulation block sizes result in code rates that are not near to a maximum modulation code rate known as the Shannon capacity of a given set of constraints. Yet another drawback of forward concatenation is that modulation decoders impede the passing of soft information from a detector to the ECC decoder, thereby preventing the use of soft-decoding and/or iterative detection/decoding techniques that may improve error rate performance.

Figure 4:
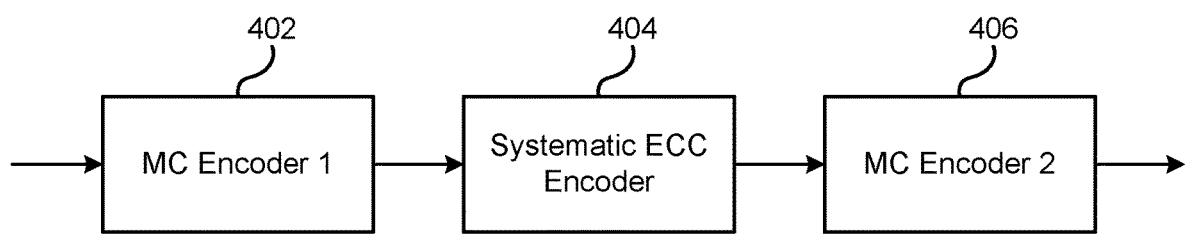
FIG. 4 is a reverse concatenation scheme based on the use of two modulation encoders, according to the prior art.

Now referring to FIG. 4, reverse concatenation (RC) for ECC is shown according to a conventional scheme. The reversal of the concatenation order of ECC and MC as shown in FIG. 3 is aimed at mitigating the drawbacks of standard concatenation, which are discussed previously.

This architecture uses a very-high-rate data-modulation encoder 402 followed by a systematic ECC encoder 404 and a parity-modulation encoder 406. Although RC schemes usually employ large block sizes for efficient modulation coding in order to achieve a very high code rate, they do not suffer from error propagation because modulation decoding of the large-block modulation code is performed after ECC decoding. Moreover, RC schemes allow the use of soft-decoding and iterative detection/decoding techniques to improve error rate performance.

Figure 5:
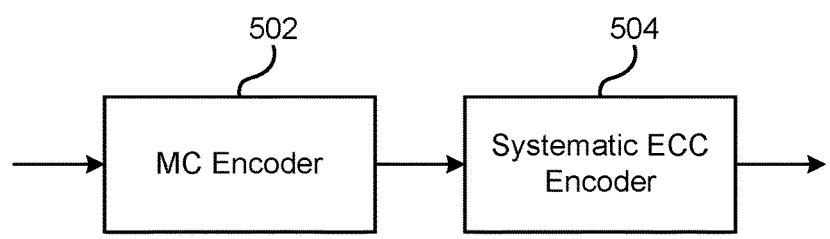
FIG. 5 is an alternative reverse concatenation (RC) architecture, according to the prior art.

An alternative RC architecture shown in FIG. 5, where ECC parity bits are inserted, using a systematic ECC encoder 504 into a modulation-encoded data stream, which has been modulation encoded using MC encoder 502, and thus avoids the use of a second parity-modulation encoder.

Disclosed herein according to various embodiments is an RC scheme which avoids the use of a second parity-modulation encoder, employs a very-high-rate enumerative modulation encoder that satisfies non-uniform modulation constraints, a systematic RS encoder, and a partial parity-symbol interleaver. This RC scheme improves upon other conventional RC architectures by achieving very tight modulation constraints while minimizing error propagation and rate loss. Furthermore, a new class of MC codes that satisfies PRML(G,I) constraints is introduced. This family of codes, which is based on serial concatenation of a prefix-constrained code and two interleaved enumerative codes with non-uniform constraints, is significantly better than other known efficient PRML(G,I) codes. For example, a low-latency rate-199/200 PRML(G=14,I=7) code may be constructed which has a block size of 200 bits, in some approaches.

The PRML(G,I) codes referenced herein may be any type of PRML(G,I) code known in the art, and the constraints (G, I, M, d, k, etc.) may be realized according to any methodology known in the art. For reference, U.S. Pat. Nos. 7,486,208 and 7,679,535, which are herein incorporated by reference, provide details on obtaining and using constraints in tape channel processing.

Among the various data storage products, HDDs were first to implement reverse concatenation in commercially available storage products, albeit more than twenty-five years after RC was first proposed. In fact, all HDDs today employ reverse concatenation. Four factors led to the acceptance of reverse concatenation in the HDD industry: 1) HDD read/write channels are proprietary and therefore the acceptance of a novel RC scheme by other companies is not needed for industry-wide acceptance, as is the case in tape drive technology such as LTO; 2) HDD read/write channels are not hampered by backward compatibility requirements; 3) the HDD industry was rapidly approaching achievable areal density limits when RC was introduced, and was therefore more willing to make the necessary investments and take the risk of implementing a new technology in order to improve the format efficiency and reduce the required signal-to-noise ratio (SNR) under normal operating conditions; and 4) recent research in RC for the type of ECC codes used in HDDs advanced to a level that allowed implementation of practical RC schemes in HDDs. However, the challenges associated with research and design of a well-thought out RC scheme for a composite code that a) provides good performance, b) satisfies tight modulation constraints, and c) is amenable to implementation is not to be underestimated. Today, magnetic tape drive systems and optical storage systems, such as CD, DVD, and BD, still use forward concatenation of ECC and MC even though the advantages of RC are known. The implementation of RC in these systems has just not been justified nor possible, absent the embodiments and approaches described herein.

The ECC schemes used in HDD products are mostly based on interleaved RS codes, non-interleaved RS codes, or LDPC codes. HDDs using forward concatenation employed three-way interleaved RS codes with 8-bit symbols, which were replaced by non-interleaved RS codes with 10-bit symbols or 12-bit symbols. Today, LDPC codes are usually used in HDDs replacing RS codes that have been used in the past. The embodiments and approaches described herein can be used in HDDs if, e.g., concatenation of RS and LDPC codes is used as the ECC scheme.

HDDs employed (d,k)-constrained RLL codes when peak detection was still used. After the introduction of PRML detection into HDDs around 1990, PRML(G,I,M) codes were initially used and were eventually replaced by PRML (G,I) codes.

The areal density (or capacity) of optical storage systems is inversely proportional to the square of the laser spot size on the disk or medium. Furthermore, the laser spot size is proportional to $r=\lambda/NA$, where NA is the numerical aperture of the objective lens and $\lambda$ is the wavelength of the light source (laser). Also, the optimal laser spot diameter may be shown to be $d=1.18 \lambda NA$. Therefore, the areal density of an optical storage system may be expressed as: Areal Density $\propto (NA/\lambda)^2$.

As all the optical disk storage technologies (CD, DVD and BD) use optical discs with a 120 mm diameter and a 1.2 mm thickness, the capacity of a single-side and single-layer disc depends on the areal density, which is determined by the minimum pit length and the groove spacing, also known as the track pitch. The minimum groove spacing is determined by diffraction. The shorter the wavelength of the laser light, the smaller the groove spacing. Similarly, the larger the NA of the objective lens, the smaller the groove spacing. Therefore, as the optical storage technology progressed from CD to DVD and then to BD, the track pitch decreased more rapidly than the wavelength of the laser source, because the NA of the objective lens increased as the laser wavelength decreased.

CD technology has been commercially available since 1982. For CD technology, $\lambda=780$ nm, NA=0.45, $r=1.73$ μm and a spot diameter of $d=2.1$ μm. Furthermore, CD capacity is 680 MB, the track pitch is 1.6 μm, the minimum pit length is 0.8 μm, and the areal density of user information is 0.41 $Gb/in^2$.

DVD technology has been commercially available since 1996. For DVD technology, $\lambda=650$ nm, NA=0.6, $r=1.08$ μm and a spot diameter of $d=1.3$ μm. Furthermore, DVD capacity is 4.7 GB (a 6.7× increase over CD capacity), the track pitch is 0.74 μm, the minimum pit length is 0.4 μm, and the areal density of user information is 2.77 $Gb/in^2$.

BD technology has been commercially available since 2006. For BD technology, $\lambda=405$ nm, NA=0.85, $r=0.47$ μm and a spot diameter of $d=0.6$ μm. Furthermore, BD capacity is 25 GB (a 5.3× increase over DVD capacity), the track pitch is 0.32 μm, the minimum pit length is 0.15 μm, and the areal density of user information is 14.73 $Gb/in^2$.

The ECC schemes used in optical data storage products are typically based on interleaved codes with two RS component codes (composite codes), such as product codes or concatenated codes. An RS(n,k,d) code with m-bit symbols has a dimension of k symbols, a length of n symbols and a minimum Hamming distance of d. CD technology uses a cross-interleaved concatenated RS coding scheme where the outer code is a RS(28,24,5) code with 8-bit symbols and the inner code is a RS(32,28,5) code with 8-bit symbols. CD concatenated coding scheme uses three stages of interleaving where the second stage is a cross-interleaving stage. The CD encoding scheme is known as Cross-Interleaved Reed Solomon Coding (CIRC). DVD technology uses an RS product code where the column code is RS(208,192,17) code with 8-bit symbols and the row code is a RS(182,172, 11) code with 8-bit symbols. BD technology uses a long-distance code (LDC), namely an RS(248,216,33) code with 8-bit symbols. LDC-encoded data is multiplexed with code words from an RS(62,30,33) burst-indicating subcode (BIS). In a BD frame, 152 LDC code words are multiplexed with 12 burst-indicating code words. Note that 4 burst-indicating picket code words correspond to the length of one LDC code word, i.e., 248 bytes. Therefore, the final ECC array in BD has 248 rows and 152 LDC columns and (12/4)=3 picket columns, i.e., a total of 155 columns, where each column is either an LDC code word or 4 BIS code words. This ECC array is written row by row onto BD, thus interleaving the LDC and BIS code words.

All the modulation codes used in optical storage drives are dc-free allowing the use of simple servo systems that extract tracking information from the data track. Furthermore, they either satisfy d=1 constraint ensuring 2T minimum run-length in encoded data or a tighter d=2 constraint ensuring 3T minimum run-length in encoded data. Optical disks with very small pits and lands are very difficult to replicate and suffer from bit-error-rate degradation. RLL d=1 and d=2 sequences have 2× to 3× larger minimum pit size than uncoded sequences and encode more than one user bit per minimum pit length as (d+1)R>1. Therefore, they achieve higher user areal density without sacrificing data integrity. CDs use rate-8/17 (d=2,k=10) dc-free modulation code which is a concatenation of a rate-8/14 eight-to-fourteen (EFM) modulation code and insertion of three merging bits per 14-bit block. DVDs use an advanced rate-8/16 (d=2,k=10) dc-free modulation code known as EFMPlus. Note that the rate-8/16 EFMPlus code has the same basic parameters as EFM but 6.25% higher code rate providing improved format efficiency. BDs use a rate 2/3 (d=1,k=7) dc-free variable-length modulation code known as 17PP which has a parity-preserve (PP) property for efficient dc-control. Furthermore, the 17PP modulation code used in BD satisfies a repeated minimum transition run-length (RMTR) constraint which limits the number of consecutive 2T minimum run-lengths in the 17PP code to six. The RMTR constraint improves system robustness, in particular the robustness to tangential tilt. The rate-2/3 variable-length 17PP code maps data words of length 2, 4, 6 or 8 bits into code words of length 3, 6, 9 and 12 bits, respectively.

Linear Tape Open (LTO) technology was developed at the end of the 1990s and the first generation of LTO tape drives (LTO-1) became commercially available in 2000. In the past decade, about every 2.5 years (on average) a new generation of LTO tape drive, which doubles the tape cartridge capacity, has been introduced. Coding schemes used in enterprise tape drives are very similar to the coding schemes used in mid-range LTO tape drives. Therefore, for the remainder of this description, only the parameters of LTO ECC schemes are presented for the sake of brevity.

The ECC scheme used in LTO is an RS-based product coding scheme with a significant degree of interleaving along and across the tape tracks. In the first four LTO generations (LTO-1 to LTO-4), an RS(64,54,11) column code (C2 code) with ten parity bytes is used that allowed correction of 1 dead track out of 8 simultaneously written tracks in LTO-1 and LTO-2, and 2 dead tracks out of 16 simultaneously written tracks in LTO-3 and LTO-4. In LTO-5 tape drives, which became commercially available in 2010, an RS(96,84,13) column code (C2 code) with twelve parity bytes is used allowing the correction of 2 dead tracks out of 16 tracks that are simultaneously written on LTO-5 advanced metal particle tape. In the first three LTO generations, an RS(240,234,7) row code (C1 code) with six parity bytes is used. In LTO-4 and LTO-5 tape drives, the number of row parity bytes is increased from six to ten bytes, i.e., an RS(240,230,11) row code (C1 code) is used to provide an improved along-the-track error correction capability.

Three types of MC are used in LTO tape drives. In LTO-1 tape drives, rate-2/3 fixed-length (d=1,k=7) code is used because detection is based on peak detection which is inferior to PRML detection in terms of error rate performance, but is simpler to implement. The rate-2/3 fixed-length finite-state (d=1,k=7) code in LTO-1 maps 4-bit data words into 6-bit code words. Furthermore, the code is a 7-state code.

In the next three LTO tape drive generations of LTO-2 to LTO-4, a rate-16/17 twins-constrained code in conjunction with 1/(1+D) precoding is used. This code limits the maximum number of consecutive NRZI twins to t=11, where a twin is either 00 or 11. The code also limits the maximum run length of NRZI zeros to k=14 and the maximum run length of NRZI ones to j=14. Furthermore, the maximum length of the alternating-bit pattern (VFO pattern in NRZI notation) is limited to a=24 and there are at least 2 NRZI ones (transitions) within each 17-bit NRZI code word. As the set of all (j=14, k=14, t=11,a=24)-constrained NRZI sequences is identical with the set of all 1/(1+D)-precoded (G=13,I=11,M=23)-constrained sequences, the LTO-4 MC code is a (G=13,I=11) code.

In LTO-5 tape drives, a rate-32/33 (j=15,k=15,t=11,a=24) twins-constrained code in conjunction with 1/(1+D) precoding is used. The LTO-5 modulation code has almost the same basic parameters as the LTO-4 modulation code, but 3% higher code rate providing improved format efficiency. As the set of all (j=15, k=15, t=11,a=24)-constrained NRZI sequences is identical with the set of all 1/(1+D)-precoded (G=14,I=11,M=23)-constrained sequences, the LTO-5 MC code is a (G=14,I=11) code.

In general, construction of codes of large block length (long codes) with good distance properties (good error performance) is a very difficult problem. Furthermore, long codes may only be used in practical schemes if their decoding is not too complex. In practice, two or more short codes are combined to obtain good constructions of long codes that are decodable with reasonable (not prohibitive) implementation complexity. These codes, which are formed from two or more component codes using interleaving if necessary, may be referred to as composite codes, as known in the art. Practical encoding schemes for composite codes usually use the encoders of the component codes. Similarly, practical decoding schemes of composite codes usually use decoders of the component codes. For example, two encoders associated with two component codes may be serially concatenated and some type of interleaver may be used between the two encoders for the component codes.

Figure 6:
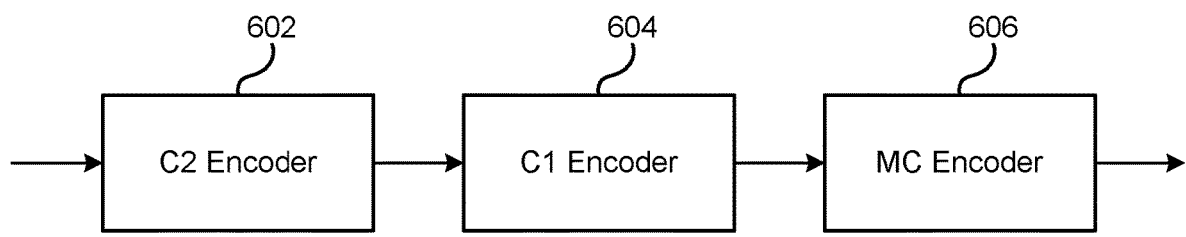
FIG. 6 shows an encoding scheme for a composite code in schematic form, according to one embodiment.

FIG. 6 shows an encoding scheme for a composite code in schematic form (possible interleaver between C2 encoder and C1 encoder not shown) that may be used in tape drives, according to implementations in LTO tape drives. A column encoder is also referred to as C2 encoder and a row encoder is referred to as C1 encoder. The order of the C2 encoder 602, C1 encoder 604, and MC encoder 606 shown may be used in LTO tape drives in one approach. Note that the order of C2 and C1 is interchangeable since a product coding scheme is used in LTO.

Figure 7:
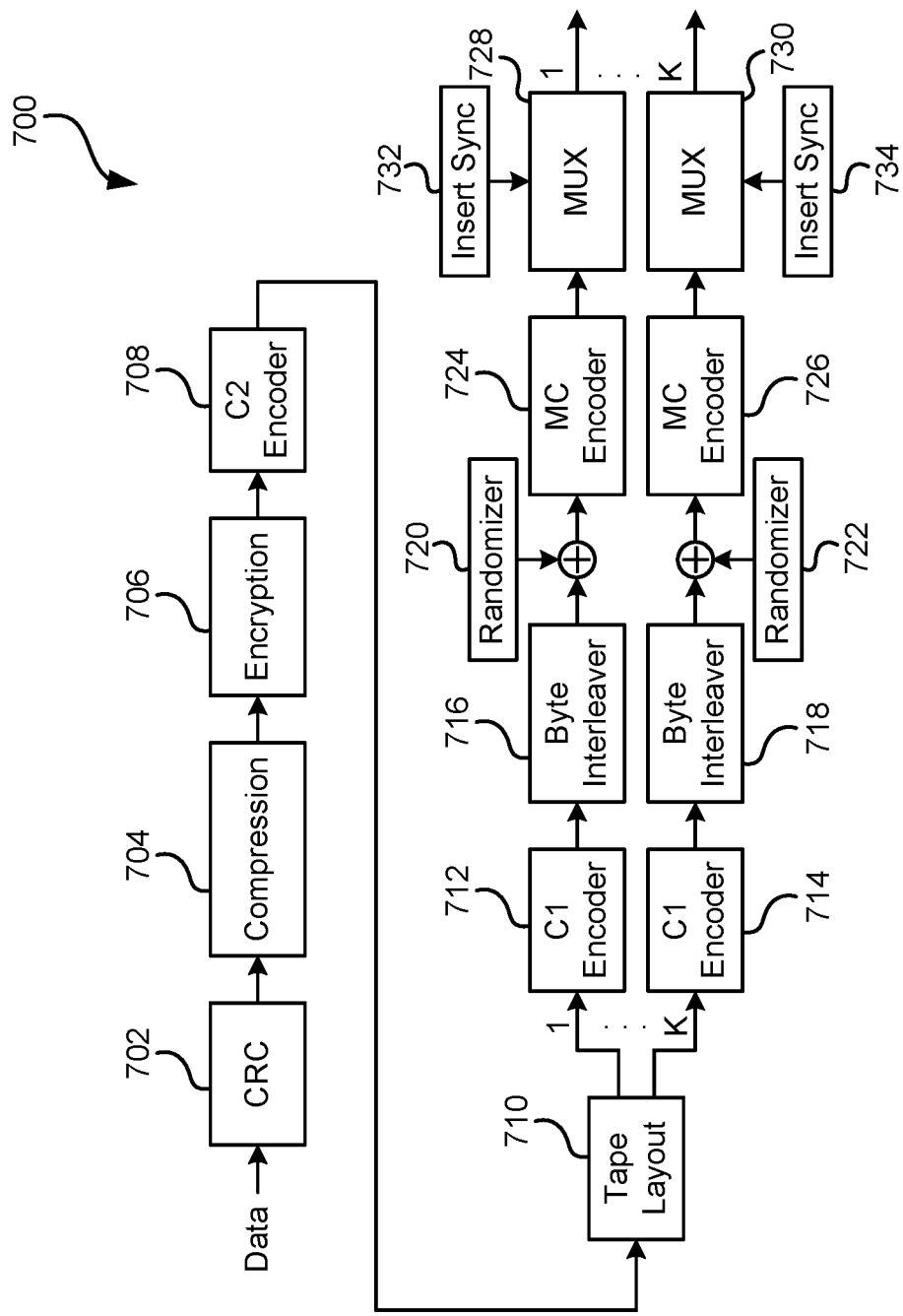
FIG. 7 a conceptual data flow in a tape drive with simultaneously written tracks, according to one embodiment.

FIG. 7 shows, in detailed form, a conceptual data flow 700 in a tape drive with K simultaneously written tracks including the operations of cyclic redundancy check (CRC) error detection code 702, compression 704, encryption 706, C2 encoding 708, and tape layout addition 710, according to one embodiment. The data flow 700 also includes individual C1 encoding 712, . . . , 714, byte interleaving 716, . . . , 718, scrambling (data randomization) 720, . . . , 722, MC encoding 724, . . . , 726, synchronization insertion 732, . . . , 734, and multiplexing 728, . . . , 730 for each track 1, . . . , K.

In the following descriptions, most of these operations are not shown to simplify description as the order of ECC and MC operations are the focus of the descriptions. However, any of the descriptions herein may include additional operations not depicted, but described in other figures.

Figure 8:
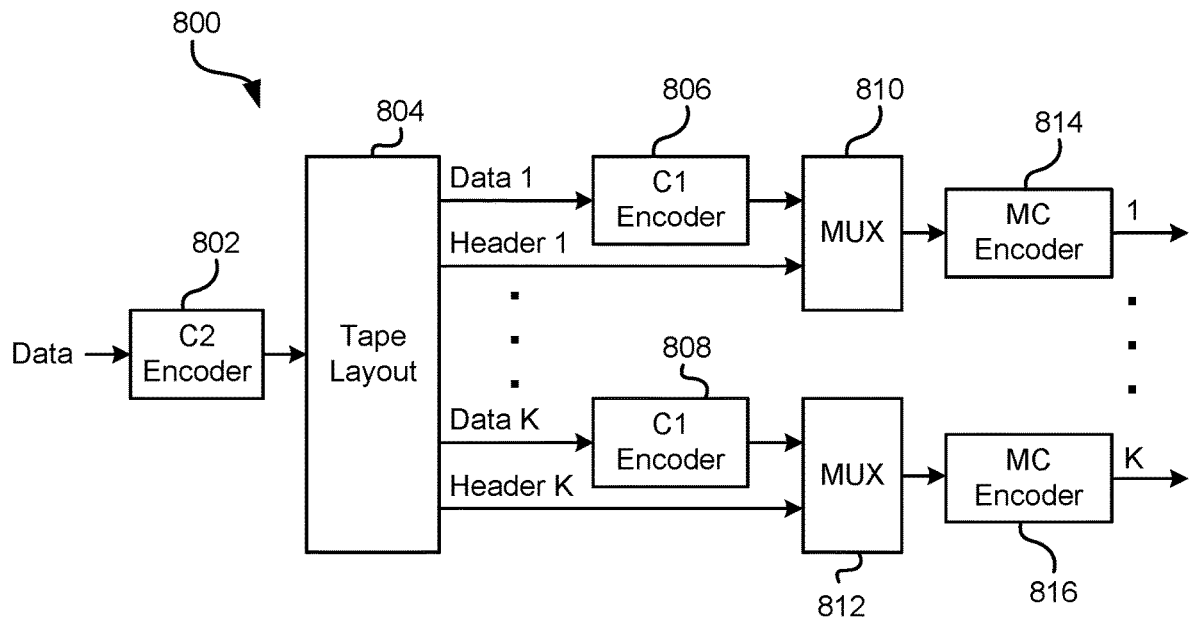
FIG. 8 is a data flow of an architecture for an LTO tape drive, according to one embodiment.

FIG. 8 shows, in simplified form, coding operations 800 in LTO tape drives, in one approach. Data is C2-encoded using a C2 encoder 802. Then, the tape layout 804 generates headers (Header 1 . . . Header K) associated with data portions of subunits of a data set and appends the headers after the data portions of the subunits of the data set are C1-encoded in the C1 encoders 806, . . . , 808. Headers include two-byte CRC but are not ECC-encoded. Then headers and data are multiplexed 810, ..., 812, before being modulation-encoded using the MC encoders 814, ... 816.

Each data set includes multiple subunits or subdata sets and each subdata set is a two-dimensional array with each row of a subdata set defined to be a "subunit of a data set." In LTO, each encoded-subdata set includes two (for generations LTO1-LTO4) or four (LTO5) C1 codewords. Therefore, in general, an encoded-subdata set includes one or more C1 codewords. Usually hundreds of headers are assigned to a single data set because each data set includes multiple subdata sets and each row of a column-encoded subdata set is assigned a header.

Figure 16:
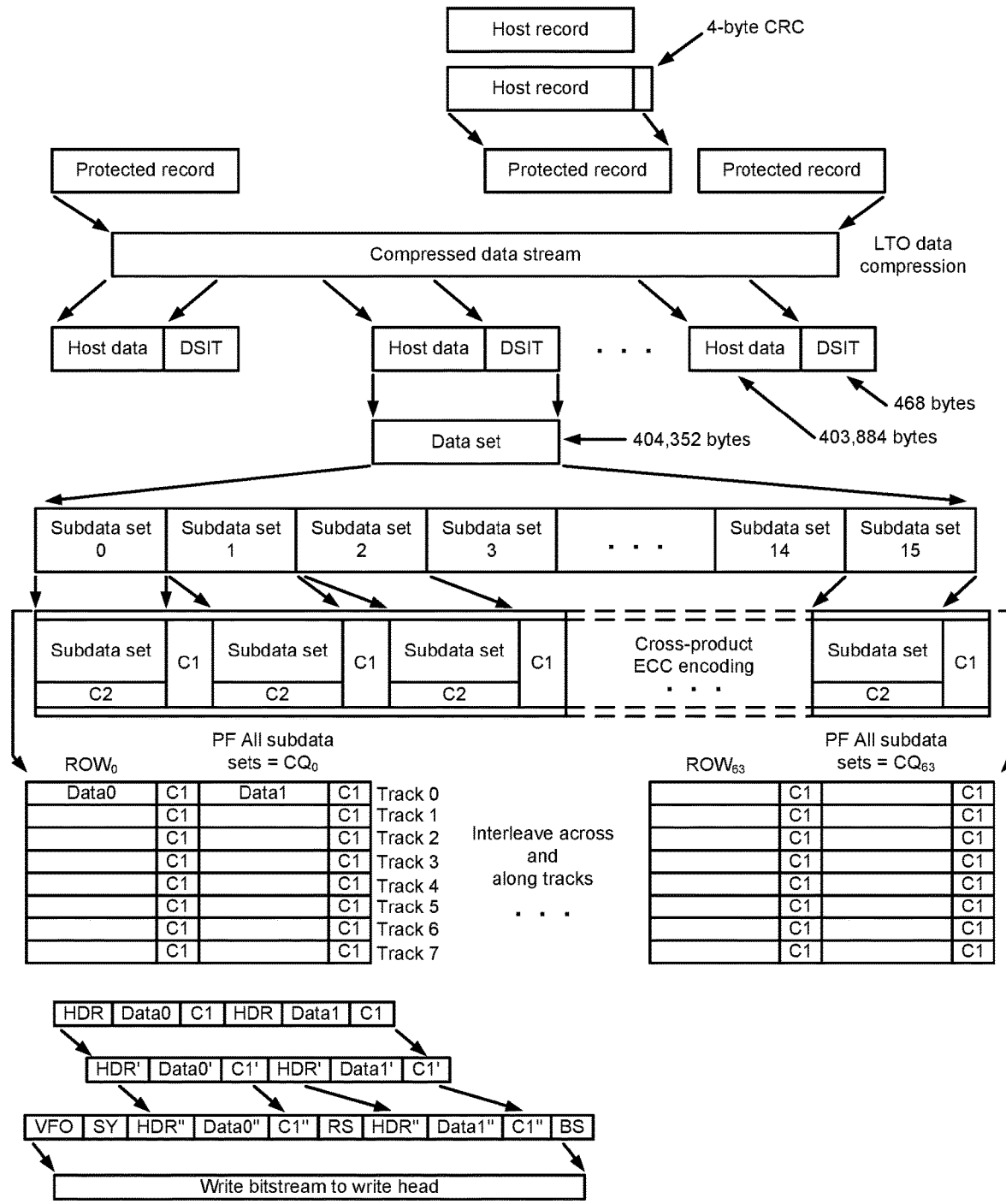
FIG. 16 shows a data flow for a linear tape open (LTO) tape drive, in one approach.

As shown in FIG. 16, in LTO1-LTO2, data flow processing is performed for K=8 tracks. Each data set includes multiple subdata sets. In this example, a data set includes 16 subdata sets. Each subdata set is a two-dimensional array and is protected after encoding by a row code C1 and a column code C2. As can be seen, each encoded-subdata set has C1 row parity bytes and C2 column parity bytes. The encoded subdata sets are shown such that C2 encoding is performed first (extension, i.e., adding parity bytes in the vertical direction) followed by C1 encoding (extension, i.e., adding parity bytes in the horizontal direction). Actually a row of an encoded-subdata set (subunit of a data set) includes two byte-interleaved C1 codewords (LTO1-LTO4) or four byte-interleaved C1 codewords (LTO5). A header is attached to each such "subunit" to identify rows of encoded-subdata sets. This "subunit" may be envisioned as a packet or envelope in which there is a piece of encoded information. The header is the address on top of the packet or the envelope. The headers are used by the receiver to place each received packet or envelope into the correct subdata set and correct row such that C1 and C2 decoding may be performed. C1 and C2 decoding is based on subdata sets. As shown in FIG. 16, e.g., Data0 and C1, Data1 and C1, etc. Actually, Data0 and C1 includes two (LTO1-LTO4) or four (LTO5) byte-interleaved C1 codewords. So the rectangle C1 in a row of an encoded subdata set indicates the parity bytes associated with two (LTO1-LTO4) or four (LTO5) C1 codewords. The bottom rows of an encoded subdata set show that there is not always data put into these packets or envelopes, but the content of the packet or envelope may also be only C2 parity which is again protected by C1 parity bytes and this type of packet also receives a header (the bottom rows of an encoded subdata set).

In LTO, two such headerized packets are put together (in FIG. 16 indicated by CQ standing for codeword quad because in LTO1-LTO4 each packet contains two byte-interleaved C1 codewords and therefore two packets contain four C1 codewords, i.e., quad). After randomization and modulation coding (referred to as RLL coding in FIG. 16) the two packets are padded with synchronization patterns. As shown in FIG. 16, data may be processed from each track by adding headers to allow C1 codewords to be identified, data is randomized (as indicated by HCR', Data0', C1', etc.), data is RLL-encoded as synchronization fields are added (as indicated by HCR", Data0", C1", etc.), data undergoes write equalization, and then read-while-write and rewrites may be performed to write the data.

According to some approaches, encoding for product codes may be performed in one of two ways. According to a first approach, in a first step, data portions of a data set are C2-encoded and then both data portions of the data set and C2-parity portions generated in the first step are C1-encoded. In a second approach, in a first step, data portions of the data set are C1-encoded and then both data portions of the data set and C1-parity portions generated in the first step are C2-encoded.

Figure 9:
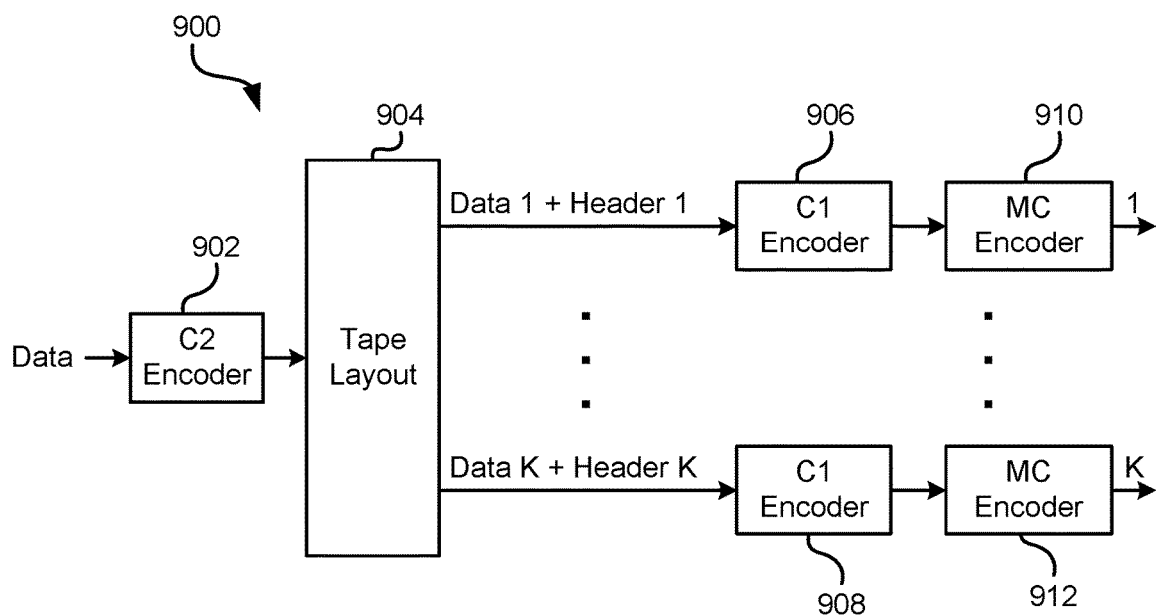
FIG. 9 is a data flow of an architecture for some enterprise tape drives, according to one embodiment.

FIG. 9 shows, in simplified form, coding operations 900 of some enterprise tape drives, in one approach. Data is C2-encoded using a C2 encoder 902. Then, the tape layout 904 generates headers (Header 1 ... Header K) associated with data units. Data units and their corresponding headers, which include two-byte CRCs, are jointly C1-encoded in the C1 encoders 906, ..., 908, in one approach. Then, modulation encoding 910, ... 912, takes place on the data units and their corresponding headers.

In one approach, an RC scheme may perform conventional RC in the sense that it reverses the order of ECC and MC. The rate of the modulation code may be 0.9951 whereas the LTO-5 modulation code rate is 32/33. This results in a 2.6% improvement in modulation code rate providing a higher tape format efficiency.

Figure 10:
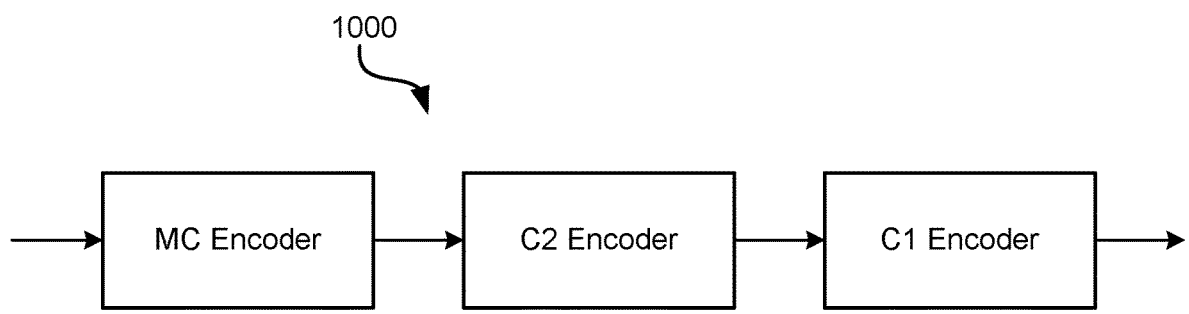
FIG. 10 shows an order of coding operations in one approach.

FIG. 10 shows, in simplified form, the order of coding operations 1000 in one approach. The modulation code maintains the interleaved I=11 modulation constraint satisfied in LTO-2 to LTO-5 tape drive generations. However, the G-constraint is weakened from G=14 in LTO-5 to G=22 because insertion of parity symbols by the column code weakens the modulation constraints.

Another significant drawback of this RC scheme is its high implementation complexity exacerbating the use of this RC architecture for product codes in practice. The existing RC architecture for product codes requires a complete overhaul and redesign of existing data flow architectures which is prohibitively complex assuming that backward compatibility must be provided.

In addition to the implementation complexity, another drawback of this approach is that C2 symbol insertion after modulation coding weakens the achievable modulation constraints causing degradation in timing recovery and thus higher error rate at the input of C1 decoders. Furthermore, this particular RC scheme is not designed to satisfy non-uniform constraints. Therefore, the overall modulation constraints satisfied by this scheme are not very tight.

Figure 11:
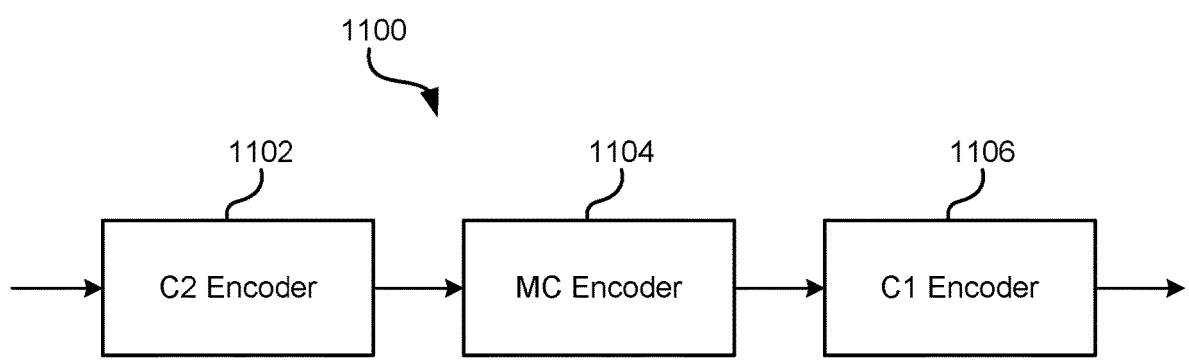
FIG. 11 shows a novel order of coding operations, according to one embodiment.

A novel approach to reverse concatenation for composite error correcting codes is now discussed, according to one embodiment. FIG. 11 depicts a multi-stage encoding structure 1100 with a new order of C2 encoding 1102, MC encoding 1104, and C1 encoding 1106, in schematic form. Until now, all designed RC schemes completely reversed the order of ECC and MC. As shown in FIG. 11, MC encoding 1104 and ECC (C2 encoding 1102) are not completely reversed and MC encoding 1104 is performed subsequent to C2 ECC encoding 1102 but prior to C1 encoding 1106. This order of operations may be referred to as partial reverse concatenation (PRC). In general, the C1 encoding 1106 or the C2 encoding 1102 may be an encoder for a single ECC code, such as a BCH code, an RS code, an LDPC code, etc., or for a composite ECC code, such as a product code, a concatenated code, a bicyclic code, a cross-interleaved code, a diamond code, a turbo code, etc., i.e., the error correction coding may use more than two component codes. Furthermore, there may be stages of interleaving between the various ECC encoding stages. PRC schemes perform a first ECC encoding step followed by a second modulation coding step and a third ECC encoding step. An additional modulation coding step after the third ECC encoding step is optional and therefore is not shown in FIG. 11.

As shown in FIG. 11, data sets are encoded using the C2 encoding scheme before any portion of the data sets are encoded using the modulation encoding scheme and the C1 encoding scheme.

The PRC scheme has several advantages over conventional RC schemes for product codes. It is simple to implement since all that is switched is the order of MC and C1 encoding as compared to conventional data flow architectures. Therefore, the PRC scheme may be implemented with relatively small changes to the existing data flow architecture. This represents a major advantage for tape drive systems as they usually are expected to satisfy backward compatibility requirements. Also, C2 symbols are not inserted into the MC-encoded data stream and the PRC scheme may satisfy non-uniform modulation constraints resulting in tighter overall modulation constraints, improved timing recovery, and improved performance.

The PRC scheme may be used in HDDs, optical storage drives, and tape drives that employ an ECC architecture based on composite codes, such as a product coding scheme. HDDs use one-dimensional concentric data tracks, whereas optical storage devices use a one-dimensional spiral-shaped track to store data. Linear tape drives simultaneously write and read K parallel tracks, which are also parallel to the tape edge. HDDs, optical storage drives, and tape drives operate either in a constant linear velocity (CLV) mode or in a constant angular velocity (CAV) mode. Linear tape drives use CLV mode whereas HDDs use CAV mode. Optical storage devices use either CLV or CAV modes. Zoned Constant Linear Velocity (ZCLV) is a modified form of CLV that is used in high-speed CD and DVD recorders. The ZCLV mode divides a disc into a fixed number of zones, where each zone is assigned a constant linear velocity. The ZCLV mode is a compromise between the CAV mode providing faster seek times and the CLV mode providing higher storage capacities.

In general, the C1 code in a PRC scheme may be any linear or nonlinear code, e.g., an LDPC code, a binary BCH code, or a q-ary BCH code, as well as an RS code, or a composite code. Although the C2 code in a PRC scheme may, in general, be any linear or nonlinear code including a composite code, an RS code may be the preferred choice for the C2 code in one embodiment.

In some more generally described embodiments, a first ECC encoding is performed (this first encoding may be based on a composite code, i.e., it may have two or more component codes), followed by modulation encoding and then by a second ECC encoding (this second encoding may be based on a composite code, i.e., it may have two or more component codes). After these stages, there may be an optional second modulation coding performed.

Figure 12:
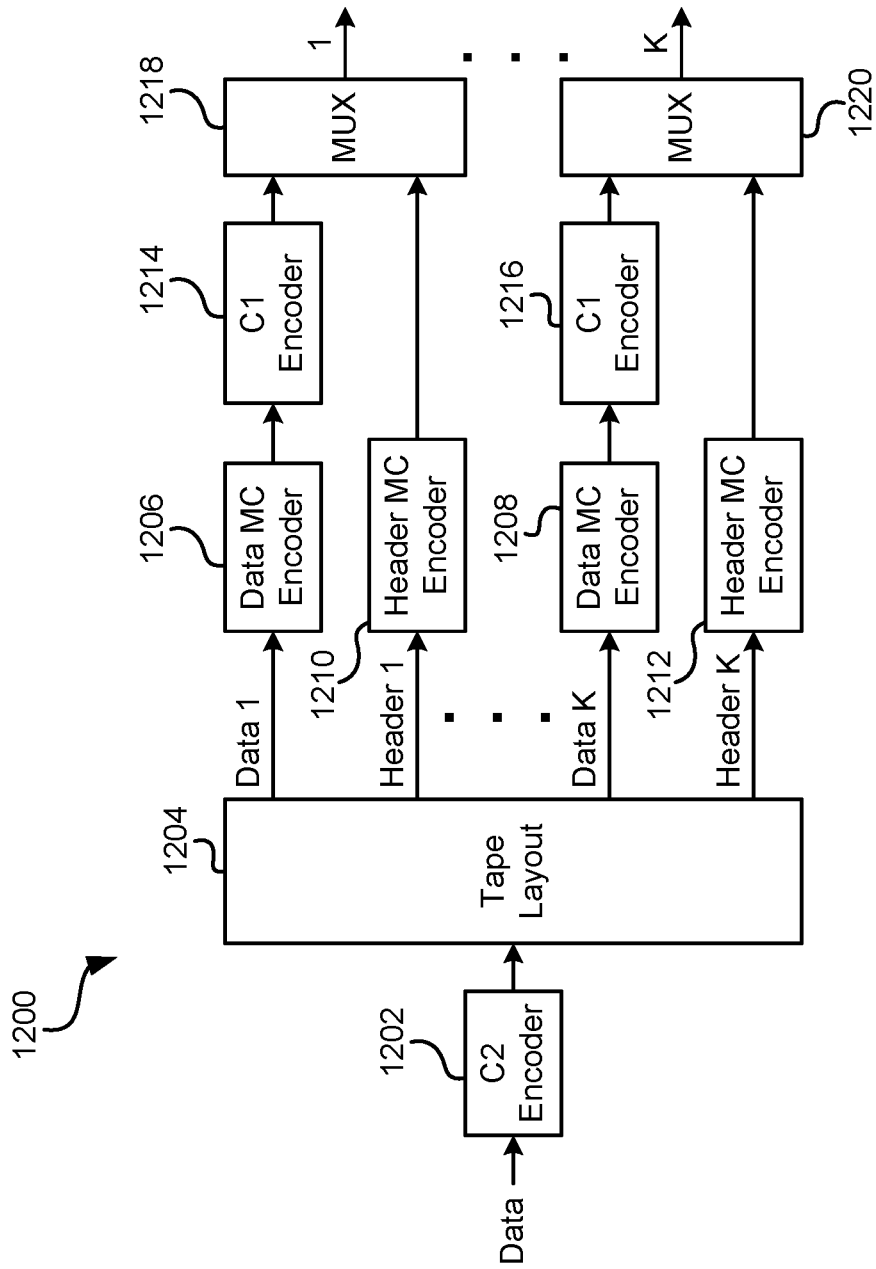
FIG. 12 is a data flow of a write channel architecture, according to one embodiment.

Now referring to FIG. 12, a first embodiment of a data flow 1200 of an architecture that is similar to the architecture used in LTO tape drives is shown. However, the data unit headers are not C1-encoded as in LTO tape drives.

The rows of a C2-encoded data array are assigned to K data tracks by the tape layout 1204 after passing through the C2 encoder 1202. The data units are first MC-encoded (using a separate data MC encoder 1206, . . . , 1208) and then C1-encoded using a C1 encoder 1214, . . . , 1216, whereas the headers are only MC-encoded (using a separate header MC encoder 1210, . . . , 1212). As the length of the data units and the headers are very different, two different MC encoders are used for encoding data units and headers, that can accommodate these differences. The MC-encoded headers are then appended to the MC-encoded and C1-encoded data units, i.e., MC-encoded headers and MC-encoded and C1-encoded data units are multiplexed (using the multiplexers 1218, . . . , 1220) and recorded onto tape tracks.

In one specific embodiment of the data flow 1200 shown in FIG. 12, PRML(G,I,M) modulation codes are used. This MC may be an enumerative MTR (eMTR) code known in the art. The rows of a data array that have been column encoded by an RS(96,84,13) code in the C2 encoder 1202 are assigned to 16 data tracks by the tape layout (K=16). The length of the rows of the column-encoded data array is 232*4=928 bytes (data units).

The data units are first MC-encoded using a rate-232/234 eMTR code (using the data MC encoders 1206, . . . , 1208) and then RS(246,234,13)-encoded (using the C1 encoders 1214, . . . , 1216). The rate-232/234 eMTR code satisfies the constraints G=12, I=6 and M=22. The headers are only MC-encoded using a rate-32/33 modulation code (using the header MC encoders 1210, . . . , 1212), as in LTO-5 tape drives. The rate-32/33 MC-encoded headers are then appended to the rate-232/234 MC-encoded and RS(246,234,13)-encoded data units, i.e., rate-32/33 MC-encoded headers and rate-232/234 MC-encoded and RS(246,234,13)-encoded data units are multiplexed (using the multiplexers 1218, . . . , 1220) and then written onto tape tracks.

Figure 13:
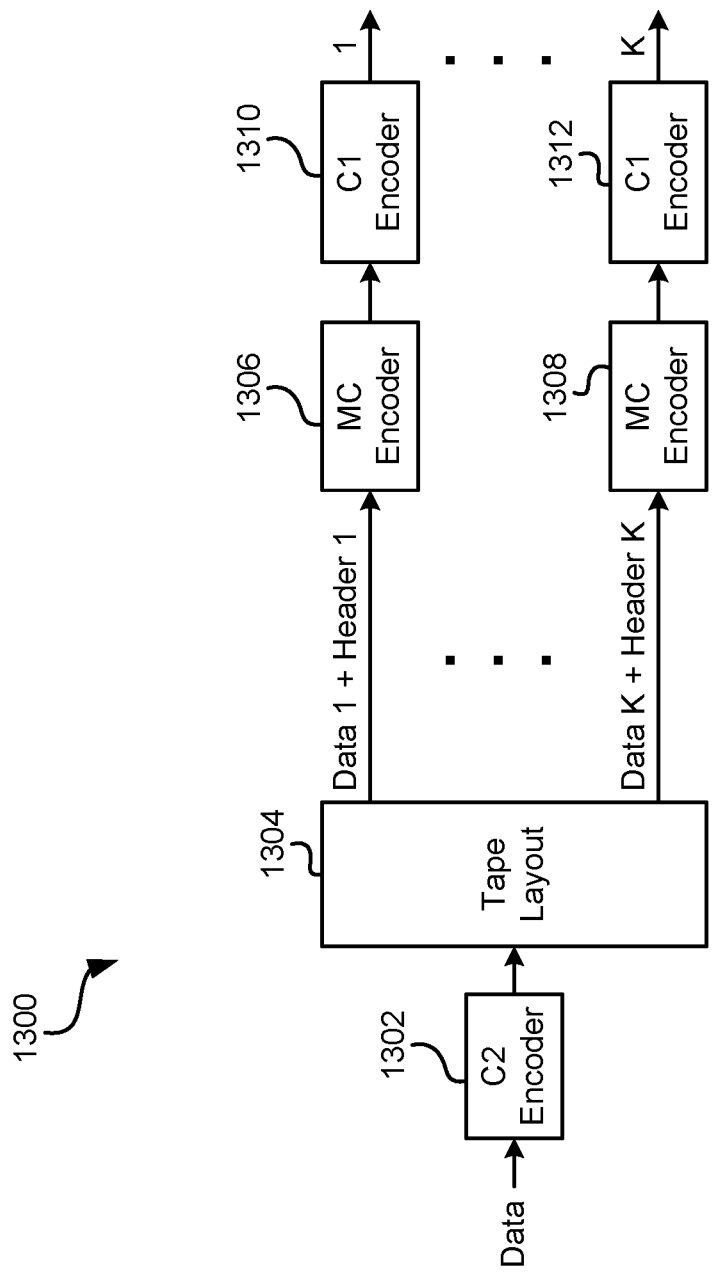
FIG. 13 is a data flow of a write channel architecture, according to one embodiment.

According to another embodiment, as shown in FIG. 13, a data flow 1300 for an architecture that is similar to the architecture used in some enterprise tape drives is shown. Specifically, the data unit headers are C1-encoded as in some enterprise tape drives.

The rows of a C2-encoded data array are assigned to K data tracks by the tape layout after being C2-encoded using the C2 encoder 1302, in one approach. The data units and the headers are first MC-encoded (using the MC encoders 1306, . . . , 1308), and then C1-encoded (using the C1 encoders 1310, . . . , 1312). Note that the same MC code may be used to encode both data and header, in this embodiment, using the MC encoders 1306, . . . , 1308. The MC-encoded and C1-encoded data units and headers are then recorded onto tape tracks.

According to a specific embodiment, a PRML(G,I,M) modulation code may be used which are enumerative MTR (eMTR) codes, as in the first embodiment. The rows of a data array that have been column encoded by an RS(96,84, 13) code (using the C2 encoder 1302), are assigned to 32 data tracks by the tape layout 1304, e.g., K=32. The length of the rows of the column-encoded data array is 229*4=916 bytes (data units). After appending a 12-byte header to a row of the column-encoded data array, the length of the rows become 928 bytes, which are referred to as designated rows herein. The designated rows are then first MC-encoded using a rate-232/234 eMTR code (using the MC encoders 1306, . . . , 1308), and then RS(246,234,13)-encoded (using the C1 encoders 1310, . . . , 1312). The rate-232/234 eMTR code satisfies the constraints G=12, I=6 and M=22. Finally, the MC-encoded and RS-encoded designated rows are recorded onto tape tracks. Note that in each track C1 parity symbols may be divided into multiple pairs of bits and then inserted into the C2- and MC-encoded data stream two bits at a time resulting in the tight overall constraints (G=14, I=7, and M=24) after C1 encoding. Therefore, PRC-encoded data satisfies tighter constraints than the constraints achievable with conventional RC for product codes, in some embodiments.

This coding scheme may be used for any optical storage device, in some approaches. Specifically, MC is performed subsequent to C2 ECC encoding, but prior to C1 encoding. The MC code may preferably be a dc-free RLL(d,k) code.

C1-encoded data is then written on an optical storage medium, e.g., an optical storage disk.

Figure 14:
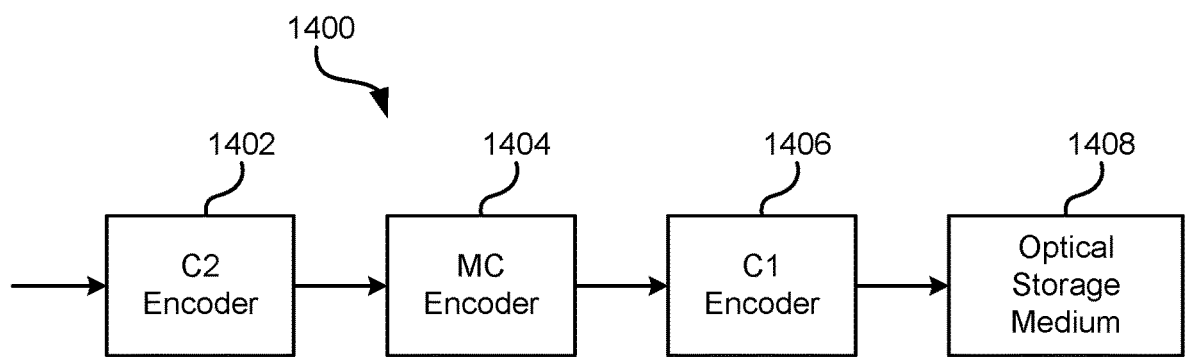
FIG. 14 shows a data flow for a partial reverse concatenated (PRC)-encoded optical storage medium, in one approach.

FIG. 14 depicts the data flow 1400 for a PRC-encoded optical medium, in one approach. As shown, data is C2-encoded using the C2 encoder 1402, modulation encoded using the MC encoder 1404, C1-encoded using the C1 encoder 1406, and then written to tracks of the optical storage medium 1408.

Figure 15:
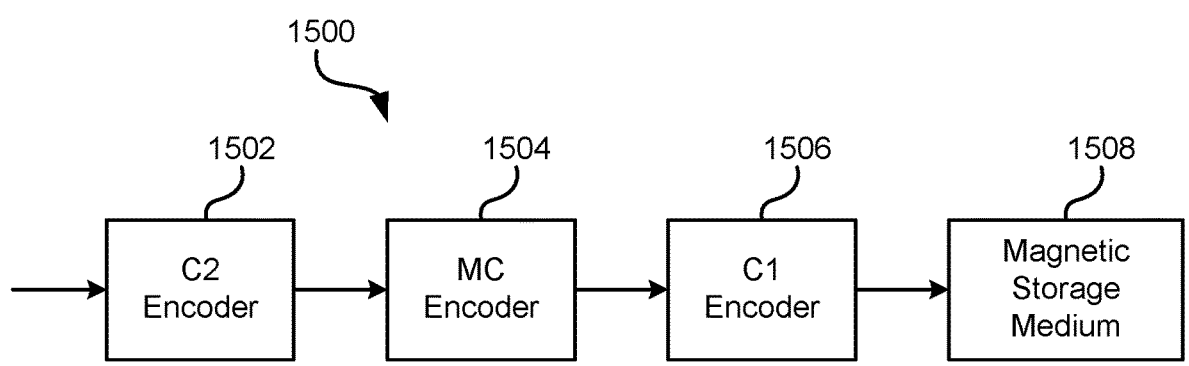
FIG. 15 shows a data flow for a PRC-encoded magnetic storage medium, in one approach.

According to another embodiment, as shown in FIG. 15, a coding scheme 1500 is presented that may be used for a HDD. In this embodiment, MC encoding 1504 is performed subsequent to C2 ECC encoding 1502, but prior to C1 encoding 1506. The MC code may preferably be a PRML (G,I) code. C1-encoded data is then magnetically recorded to a magnetic storage medium 1508, such as on a hard disk.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
a processor; and
logic integrated with the processor, executable by the processor, or integrated with and executable by the processor, the logic including:
logic configured to receive, by the processor, a data stream;
a C2 encoder module configured to C2 encode, by the processor, the data stream to generate C2-encoded data using a C2 encoding scheme;
a modulation coding encoder module configured to modulation coding (MC) encode, by the processor, the C2 encoded data to generate MC-encoded data using a modulation encoding scheme;
a C1 encoder module configured to C1 encode, by the processor, the MC encoded data to generate C1-encoded data by applying a C1 encoding scheme; and
logic configured to write, by the processor, the C1-encoded data to a storage medium of a data storage system.

2. The system as recited in claim 1, comprising logic configured to cause the processor to:
receive, by the processor, a data stream comprising one or more data sets of the data, wherein the storage medium is a linear tape open (LTO) format magnetic tape;
encode, by the processor, the one or more data sets using the C2 encoding scheme;
add, by the processor, a header to each subunit of the one or more data sets;
encode, by the processor, the headers of the subunits of the one or more data sets with a first modulation encoding scheme;
encode, by the processor, data portions of the one or more data sets with a second modulation encoding scheme;
encode, by the processor, portions of the one or more data sets using the C1 encoding scheme;
combine, by the processor, the C1-encoded data portions with the first modulation-encoded headers of the one or more data sets using a multiplexer; and
write, by the processor, the one or more combined data sets to data tracks of the magnetic tape,
wherein the one or more data sets are encoded using the C2 encoding scheme before any portion of the one or more data sets are encoded using any of: the first modulation encoding scheme, the second modulation encoding scheme, and the C1 encoding scheme.

3. The system as recited in claim 2, wherein the C2 encoding scheme comprises a Reed-Solomon RS(96,84,13) code.

4. The system as recited in claim 2, wherein the first modulation encoding scheme comprises a rate-32/33 modulation code.

5. The system as recited in claim 2, wherein the second modulation encoding scheme comprises a rate-232/234 enumerative minimum transition run-length (eMTR) modulation code satisfying constraints of G=12, I=6, and M=22.

6. The system as recited in claim 2, wherein the C1 encoding scheme comprises a Reed-Solomon RS(246,234, 13) code.

7. The system as recited in claim 2, wherein the logic configured to add the header to each subunit of the one or more data sets is configured to cause the processor to assign, by the processor, rows of a column encoded-data array to sixteen data tracks.

8. The system as recited in claim 1, comprising logic configured to cause the processor to:
receive, by the processor, a data stream comprising one or more data sets of the data, wherein the storage medium is an enterprise (not linear tape open) format magnetic tape;
encode, by the processor, the one or more data sets using the C2 encoding scheme;
add, by the processor, a header to each subunit of the one or more C2-encoded data sets after encoding the one or more data sets using the C2 encoding scheme;
encode, by the processor, the one or more headerized data sets with a modulation encoding scheme after adding the headers of the subunits to each of the one or more C2-encoded data sets;
encode, by the processor, the one or more modulation-encoded data sets using the C1 encoding scheme after encoding the one or more headerized data sets with the modulation encoding scheme; and
write, by the processor, the one or more C1-encoded data sets to data tracks of the enterprise format magnetic tape.

9. The system as recited in claim 1, wherein the C2 encoding scheme is selected from the group consisting of: an LDPC code, a binary BCH code, and a q-ary BCH code.

10. The system as recited in claim 8, wherein the modulation encoding scheme comprises a rate-232/234 enumerative minimum transition run-length (eMTR) modulation code satisfying constraints of G=12, I=6, and M=22.

11. The system as recited in claim 8, wherein the C1 encoding scheme comprises a Reed-Solomon RS(246,234, 13) code.

12. The system as recited in claim 8, wherein the logic configured to add the header to each subunit of the one or more C2-encoded data sets is configured to cause the processor to assign, by the processor, rows of a column encoded-data array to thirty-two data tracks.

13. The system as recited in claim 1, comprising logic configured to cause the processor to:
  receive, by the processor, a data stream comprising one or more data sets of the data, wherein the storage medium is an optical storage medium;
  encode, by the processor, the one or more data sets using the C2 encoding scheme;
  encode, by the processor, the one or more C2-encoded data sets with a modulation encoding scheme after encoding the one or more data sets using the C2 encoding scheme;
  encode, by the processor, the one or more modulation-encoded data sets using the C1 encoding scheme after encoding the one or more C2-encoded data sets using the modulation encoding scheme; and
  write, by the processor, the one or more C1-encoded data sets to data tracks of the optical storage medium.

14. The system as recited in claim 13, wherein the C2 encoding scheme comprises an error correction code (ECC).

15. The system as recited in claim 13, wherein the modulation encoding scheme comprises a dc-free run-length limited RLL(d,k) code.

16. The system as recited in claim 1, comprising logic configured to cause the processor to:
  receive, by the processor, a data stream comprising one or more data sets of the data, wherein the storage medium is a hard disk of a hard disk drive (HDD);
  encode, by the processor, the one or more data sets using the C2 encoding scheme;
  encode, by the processor, the one or more C2-encoded data sets with a modulation encoding scheme after encoding the one or more data sets using the C2 encoding scheme;
  encode, by the processor, the one or more modulation-encoded data sets using the C1 encoding scheme after encoding the one or more C2-encoded data sets with the modulation encoding scheme; and
  write, by the processor, the one or more C2-encoded data sets to data tracks of the hard disk.

17. The system as recited in claim 16, wherein the C2 encoding scheme comprises an error correction code (ECC).

18. The system as recited in claim 16, wherein the modulation encoding scheme comprises a rate-199/200 PRML(G,I) modulation code satisfying constraints of G=14, I=7.

19. A tape drive, comprising:
  a magnetic head;
  a controller in communication with the magnetic head;
  drive motors configured to move a tape over the magnetic head;
  guides configured to guide the tape across the tape head; and
  logic integrated with a processor, executable by the processor, or integrated with and executable by the processor, the logic being configured to cause the processor to:
  receive, by the processor, a data stream comprising data sets;
  encode, by the processor, the data sets using a C2 encoding scheme to produce C2-encoded data sets;
  assign, by the processor, the data sets to K data tracks, where K is at least 8;
  divide, by the processor, each of the C2-encoded data sets into a plurality of subunits;
  add, by the processor, a header to each subunit of the C2-encoded data sets after encoding the data sets using the C2 encoding scheme;
  in K parallel processing channels, each associated with a unique one of the data tracks, for processing the respective data sets assigned to the data track associated with the particular processing channel:
    encode in each channel, by the processor, the headers of the headerized data sets with a first modulation encoding scheme after adding the header to each of the C2-encoded data sets;
    encode in each channel, by the processor, data portions of the headerized data sets with a second modulation encoding scheme after adding the headers to each of the C2-encoded data sets;
    encode in each channel, by the processor, the data portions of the modulation-encoded data sets using a C1 encoding scheme after encoding the data portions of the headerized data sets with the second modulation encoding scheme; and
    combine in each channel, by the processor, a C1-encoded data portions with the modulation-encoded headers of the data sets; and
  write, by the magnetic head, combined C1- and C2-encoded data sets to K simultaneously-written data tracks of a magnetic tape,
  wherein the data sets are encoded using the C2 encoding scheme before any portion of the data sets are encoded using any of: the first modulation encoding scheme, the second modulation encoding scheme, and the C1 encoding scheme.

20. The tape drive as recited in claim 19, wherein the C2 encoding scheme comprises a Reed-Solomon code, and wherein the C1 encoding scheme uses a C1 code selected from the group consisting of: an LDPC code, a binary BCH code, and a q-ary BCH code.

* * * * *